United States Patent [19]

Lipp et al.

[11] Patent Number: 4,778,738
[45] Date of Patent: Oct. 18, 1988

[54] METHOD FOR PRODUCING A LUMINESCENT VIEWING SCREEN IN A FOCUS MASK CATHODE-RAY TUBE

[75] Inventors: Steven A. Lipp, Hopewell; Victor Christiano, Hamilton, both of N.J.

[73] Assignee: RCA Licensing, Princeton, N.J.

[21] Appl. No.: 896,450

[22] Filed: Aug. 14, 1986

[51] Int. Cl.⁴ .............................................. G03C 5/00
[52] U.S. Cl. ........................................ 430/26; 430/24; 430/394; 313/470; 313/525
[58] Field of Search .................. 430/24, 26, 28, 29, 430/394, 396, 291; 354/1; 313/408, 472, 525, 470

[56] References Cited

U.S. PATENT DOCUMENTS

| | | | |
|---|---|---|---|
| 2,625,734 | 1/1953 | Law | 445/4 |
| 2,840,470 | 6/1958 | Levine | 430/29 |
| 2,992,919 | 7/1961 | Beeler et al. | 430/23 |
| 3,140,176 | 7/1964 | Hoffman | 430/28 |
| 3,451,812 | 6/1969 | Tamura | 430/26 |
| 3,558,310 | 1/1971 | Mayaud | 430/25 |
| 3,661,581 | 5/1972 | Feldstein | 430/5 |
| 3,788,846 | 1/1974 | Mayaud et al. | 430/25 |
| 4,049,451 | 9/1977 | Law | 430/24 |
| 4,070,498 | 1/1978 | Nishizawa et al. | 430/26 |
| 4,112,563 | 9/1978 | Van Esdonk | 445/47 |
| 4,135,111 | 1/1979 | Verweel | 313/403 |

OTHER PUBLICATIONS

U.S. Pat. Application Ser. No. 751,863 filed on Jul. 5, 1985 by Stanley Bloom et al., titled Cathode-Ray Tube Having a Focusing Color-Selection Structure and Viewing Screen Formed Therefrom.

*Primary Examiner*—José G. Dees
*Attorney, Agent, or Firm*—Eugene M. Whitacre; Dennis H. Irlbeck; Vincent J. Coughlin, Jr.

[57] ABSTRACT

A method of producing a luminescent viewing screen using a quadrupole focus mask having apertures substantially larger than the phosphor screen elements is described. The method includes the steps of providing a film of a photosensitive polymeric substance on a faceplate and exposing the film through the focus mask. A first phosphor material is subsequently deposited on the region of the faceplate that was shadowed during the exposure. The process is repeated at different angles of exposure and with different color-emitting phosphor materials until at least two and preferably three different color emitting phosphor materials are deposited to form a cyclic array of screen elements.

6 Claims, 4 Drawing Sheets

METHOD FOR PRODUCING A LUMINESCENT VIEWING SCREEN IN A FOCUS MASK CATHODE-RAY TUBE

BACKGROUND OF THE INVENTION

The present invention relates to a method for producing a luminescent viewing screen in a cathode-ray tube (CRT) having a focus mask as a color selection electrode and, more particularly, to a method for making such a screen using a quadrupole focus mask as an optical pattern.

A conventional shadow-mask-type CRT comprises generally an evacuated envelope having therein a viewing screen comprising an array of phosphor elements of three different emission colorrs arranged in a cyclic order, means for producing three convergent electron beams directed towards the screen, and a color selection structure or shadow mask comprising a thin multiapertured sheet of metal precisely disposed between the screen and the beam-producing means. The apertured metal sheet shadows the screen, and the differences in convergence angles permit the transmitted portions of each beam to selectively excite phosphor elements of the desired emission color.

In one prior art process for forming each array of phosphor elements on a viewing faceplate of a CRT, the inner surface of the faceplate is coated with a mixture of a photosensitive binder and phosphor particles adapted to emit light of one of the three emission colors. A light field is projected from a source through the apertures in the shadow mask and onto the coating so that the shadow mask functions as a photographic master. The exposed coating is subsequently developed to produce the first color-emitting phosphor elements. The process is repeated for the second and third color-emitting phosphor elements, utilizing the same shadow mask but repositioning the light source for each exposure. Each position of the light source approximates the convergence angle of one of the electron beams which excites the respective color-emitting phosphor elements. A more complete description of a prior art process for forming a viewing screen using a shadow mask can be found in U.S. Pat. No. 2,625,734 issued to H. B. Law on Jan. 20, 1953.

A drawback of conventional shadow-mask-type CRT's is that at about the center of the shadow mask all but about 18% of the beam currents is intercepted by the electron impervious portion of the shadow mask; that is, the shadow mask is said to have a transmission of about 18%. Thus, the area of the apertures of the shadow mask is about 18% of the area of the metal sheet. Since there are no focusing fields present in a shadow mask, a corresponding portion of the viewing screen is excited by the transmitted portions iof the electron beams.

Several methods have been suggested for increasing the transmission of the color selection electrode; that is, increasing the area of the apertures with respect to the area of the color selection electrode without substantially increasing the excited portions of the viewing screen area. In one approach, the apertures in the color selection electrode are enlarged and the transmitted portions of the electron beams are focused by magnetic or electric fields produced in the vicinity of each of the apertures. One such structure is known as a quadrupole focus mask. In a second approach, each aperture in the color selection electrode is enlarged and split into two adjacent windows by a conductor. The transmitted portions of the electron beams pass through the windows of each aperture, are deflected around the conductors towards one another, and fall onto substantially the same area of the viewing screen. Such a structure is known as a deflection-and-focus mask. A variation of this latter approach is described in U.S. Pat. No. 4,651,051 issued on Mar. 17, 1987 to Bloom et al., and entitled, CATHODE-RAY TUBE HAVING A FOCUSING COLOR-SELECTION STRUCTURE AND A VIEWING SCREEN FORMED THEREFROM. The deflection and focus mask color-selection structure described in the Bloom et al. patent can be used as a photographic master for producing the viewing screen; however, no quadrupole focus mask color-selection structure has yet been developed which can also serve as a suitable photographic master for producing a viewing screen. This is because the apertures in the quadrupole focus mask are substantially larger than the individual color-emitting phosphor screen elements. While it is known from U.S. Pat. No. 3,661,581 issued to Feldstein on May 9, 1972, to temporarily reduce the size of final size circular apertures in a conventional shadow mask, such an expedient is impractical for producing a line screen using substantially rectangular apertures, such as are found in the quadrupole focus mask.

SUMMARY OF THE INVENTION

The invention relates to a method for producing a luminescent screen structure on a support surface of a cathode-ray tube (CRT). The CRT has a focus mask with a multiplicity of apertures therethrough. The screen structure on the support surface of the CRT is comprised of a multiplicity of screen elements, each of which is smaller than any of the apertures in the focus mask. Means are provided within the tube for generating and directing a plurality of electron beams which converge at different angles in the vicinity of the focus mask. The method includes the steps of coating the support surface with a film of a photosensitive polymeric substance; exposing the film to actinic radiation from a line light source projected at a first angle through the focus mask until the solubility of the irradiated regions thereof is seectively altered, thereby producing in said film regions of greatersolubility at locations shielded by the mask from the actinic radiation and regions of lesser solubility at locations exposed to actinic radiation through the apertures and then, removing those regions of the film with greater solubility. Next, the now bare areas of the support surface and the retained film regions are coated with a phosphor material. The retained film regions and the overcoating of phosphor material are removed to expose portions of the support surface while retaining the phosphor material on adjacent portions of the support surface thereby forming a multiplicity of first screen elements.

DETAILED DESCRIPTION OF THE PREFERRED EMBODIMENT

Figure 1:
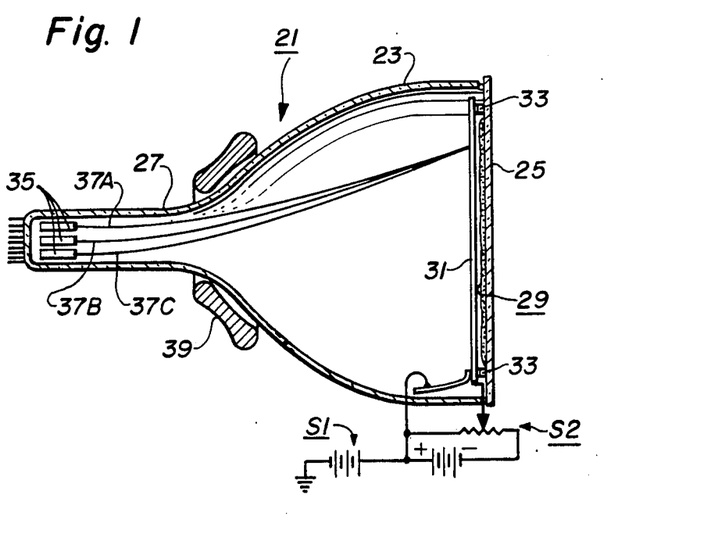
FIG. 1 is a partially-schematic top view of a CRT having a quadrupole focus mask and a viewing screen made according to the novel process.

The color cathode-ray tube 21 shown in FIG. 1 comprises an evacuated bulb 23 including a transparent support surface or faceplate 25 at one end and a neck 27 at the other end. The faceplate 25, which is shown as being flat, but may arc outwardly, supports a luminescent viewing screen 29 on its inner surface. Also, a color-selection structure or focus mask 31 is supported from three supports 33 on the inside surface of the faceplate 25. Means 35 for generating three electron beams 37A, 37B and 37C are housed in the neck 27. The beams are generated in substantially a plane, which is preferably horizontal in the normal viewing position. The beams are directed towards the screen 29 with the outer beams 37A and 37C convergent on the center beam 37B at the screen. The three beams may be deflected with the aid of deflection coils 39 to scan a raster over the focus mask 31 and the viewing screen 29.

Figure 2:
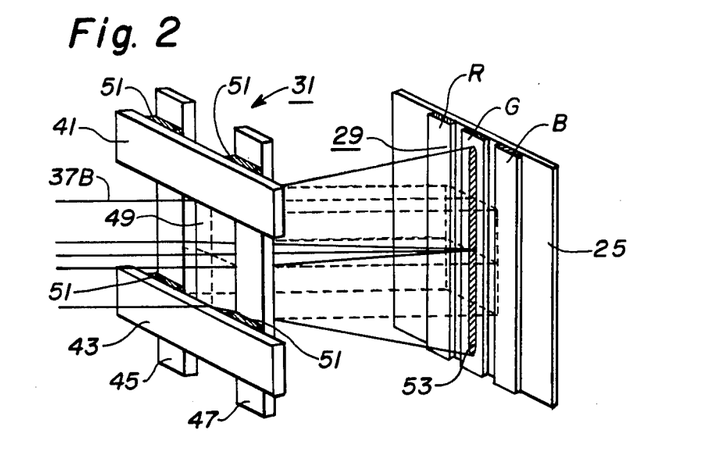
FIG. 2 shows a quadrupole focus mask operating to focus an electron beam onto a screen element of the CRT of FIG. 1.

The viewing screen 29 and the focus mask 31 are described in more detail with respect to FIG. 2. The viewing screen 29 includes a multiplicity of screen elements comprised of red-emitting, green-emitting and blue-emitting phosphor stripes R, G and B, respectively, arranged in color groups of three stripes or triads in a cyclic order and extending in a direction which is generally normal to the plane in which the electron beams are generated. In the normal viewing position for this embodiment, the phosphor stripes extend in the vertical direction. The phosphor stripes also could be separated from each other by light-absorbing material as is known in the art.

As shown in FIG. 2, the focus mask 31 is of the quadrupole type comprising orthogonal sets of support members which intersect or cross at a multiplicity of locations. Of the first set, the horizontal conductors 41 and 43 are shown. Of the second set, the vertical conductors 45 and 47 are shown. The conductors 41, 43, 45 and 47 determine one of the apertures 49 of which there are a multiplicity formed in the focus mask 31. The aforementioned conductors are insulated from each other by an insulating material 51. The three phosphor stripes associated with the aperture 49 are shown on the faceplate 25 and are designated by R (red), G (green) and B (blue). Only a few rays of the center electron beam 37B are shown in FIG. 2 forming an electron spot 53 on the phosphor stripe G. The electrical operation of the quadrupole focus mask 31 generally is described in U.S. Pat. No. 4,059,781 issued to van Alphen et al. on Nov. 22, 1977. Briefly, if the screen 29 operates at a potential $V_o$, supplied by a voltage source S1, the horizontal conductors 41 and 43 also operate at a potential of $V_o$ and the vertical conductors 45 and 47 operate at a potential of $V_o - \Delta V$ provided by a second voltage source S2. Alternatively, the horizontal conductors and the screen may operate at a potential of $V_o + \Delta V$ and the vertical conductors may operate at a potential of $V_o$. The electron beam which passes through the aperture 49 is focused in the horizontal plane and defocused in the vertical plane to form the elongated electron spot 53. The aperture 49 is typically about 0.56×0.56 mm and the electron spot 53 is about 0.10 mm wide in the center of the display screen. Each of the phosphor stripes or screen elements is about 0.13 mm wide so that color purity is maintained despite the relative large size of the apertures 49 which have a transmission of about 50%.

Figure 3:
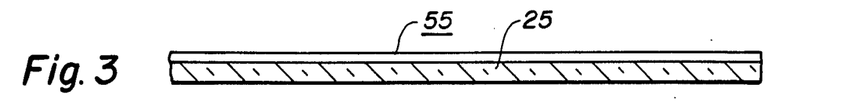
FIGS. 3-6 show the steps in forming on a support surface a multiplicity of first screen elements according to the invention.

FIGS. 3–6 show the sequence of steps in forming the multiplicity of first (or red) phosphor screen elements, e.g. the red-emitting phosphor stripes, R. As shown in FIG. 3, the support surface or faceplate 25 is coated with a film 55 of a clear photosensitive polymeric substance such as polyvinyl alcohol (PVA) suitably sensitized with ammonium or potassium dichromate. The film 55 is air dried at room temperature for several minutes and then, the quadrupole focus mask 31 is attached to supports 33, shown in FIG. 1, which locate the focus mask 31 in spaced relation to the faceplate 25.

Figure 4:
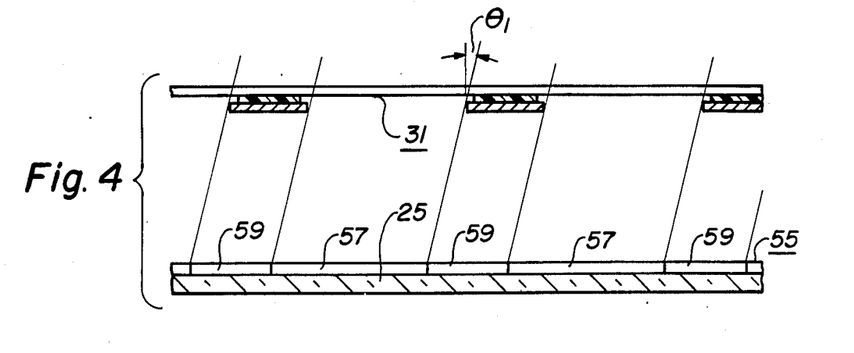
Figure 5:
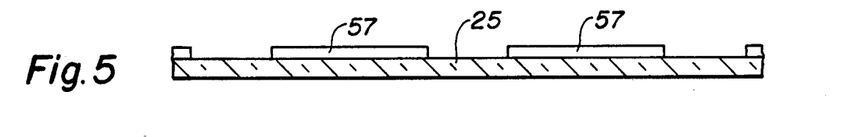
Figure 6:
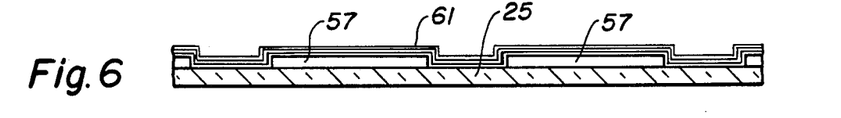
Figure 7:
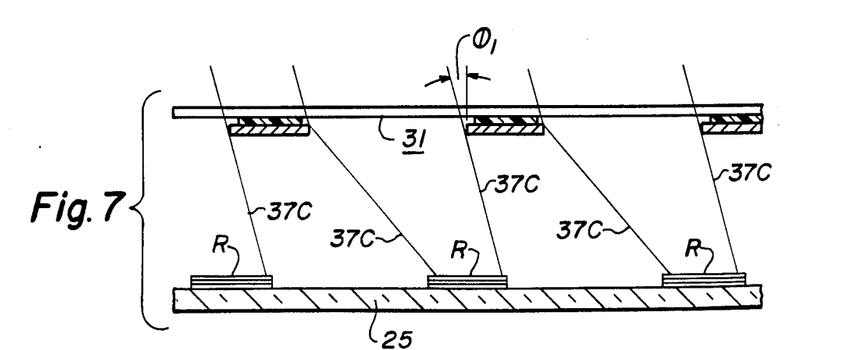
FIG. 7 shows outer electron beams passing through the focus mask and impinging on the first screen elements.

With the focus mask 31 positioned as shown in FIG. 4, the photosensitive film 55 is exposed by projecting light from a line light source (not shown) such as that described in U.S. Pat. No. 4,049,451 issued to Law on Sept. 20, 1977 and incorporated herein for disclosure purpose. The line light source should be sufficiently long to expose the screen area behind the horizontal conductors 41 and 43. The light is projected at a first angle, $\theta_1$, to the normal, through the focus mask 31 and onto the film 55, thereby hardening or rendering less soluble exposed regions 57 of the film. The shadowed or unexposed regions 59 of the film 55 shielded by the focus mask 31 from the actinic radiation are unhardened and have greater solubility than the exposed regions 57. The focus mask 31 is then removed and the unexposed regions 59 are developed by washing the film 55 with a suitable developer such as water or other suitable developer, as is known in the art. Washing removes the unexposed regions 59 of greater solubility leaving bare areas of the faceplate 25 and retained film regions corresponding to the exposed regions 57. As shown in FIG. 6, the now bare areas of the faceplate 25 and the retained film regions 57 are coated with a first phosphor material 61. Preferably the phosphor is applied as a slurry comprising a mixture of 25 to 35 weight % phosphor particles, a binder such as 3 weight % cellulose and a liquid vehicle such as ammonia and water to obtain a ph of 10. Alternatively, the slurry may contain 70 g. of phosphor, 40 g. of 10% PVA, 20 g. of 10% Ludox A.S., and 5.5 g. of a wetting agent such as Pluronic L72 with sufficient water to obtain proper viscosity. The present slurry differs from a conventional phosphor slurry in that a photosensitizer is not required since the slurry is not exposed to actinic radiation. The excess slurry material may be removed from the faceplate 25 by the method described in U.S. Pat. No. 4,254,160 issued to Raih on Mar. 3, 1981. The slurry is dried and the retained film regions 57 and the overcoating of first phosphor material 61 are removed by washing in $H_2O_2$. As shown in FIG. 7, the resulting structure includes bare portions of the faceplate 25 and stripes R of first phosphor material on adjacent portions of the support surface which form a multiplicity of first phosphor screen elements. FIG. 7 also shows the paths of the outer electron beams 37C which are focused by the focus mask 31 to impinge on the first screen elements or stripes R. Since the focus mask 31 is able to focus the electron beam onto a phosphor stripe about 0.13 mm wide, but cannot focus the light projected therethrough (FIG. 4), the light used to expose the regions 57 of the photosensitive film 55 must, in a quadrupole focus mask CRT, be directed at a different angle ($\theta_1$) than the convergence angle, $\phi_1$, of the electron beams 37C which excites the phosphor screen elements, R. This is unlike the results achieved using a conventional shadow mask where the light which exposes the conventional photosensitized phosphor slurry is projected at approximately the same angle through the shadow mask as the electron beam which excites the resultant phosphor screen element.

Figure 8:
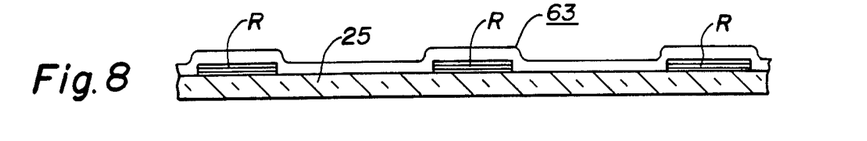
FIGS. 8–11 show the steps in forming on the support surface a multiplicity of second screen elements according to the invention.
Figure 9:
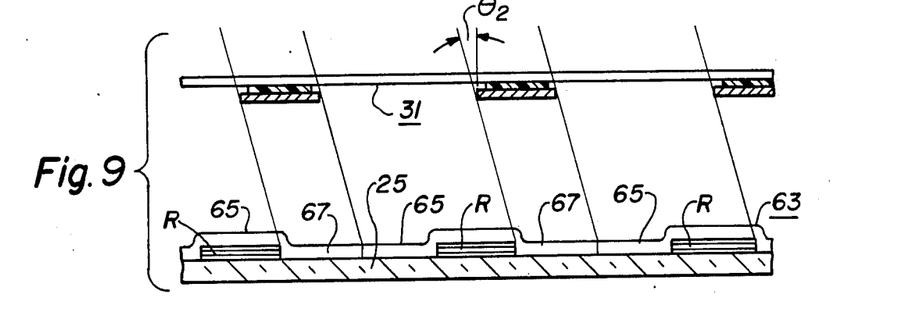
Figure 10:
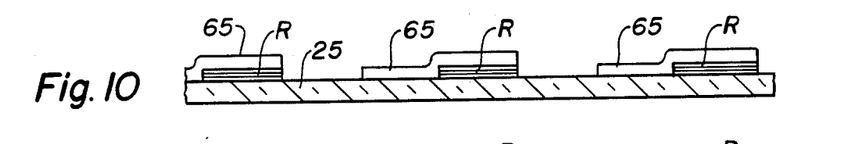
Figure 11:
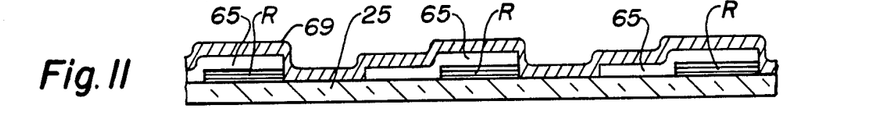
Figure 12:
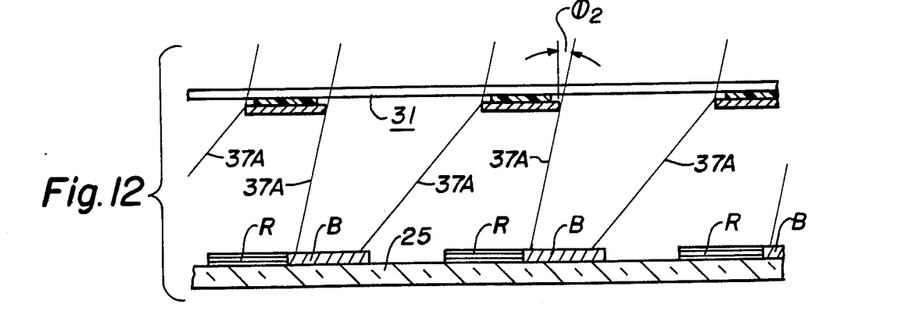
FIG. 12 shows other outer electron beams passing through the focus mask and impinging on the second screen elements.

FIGS. 8–11 show the sequence of steps in forming the multiplicity of second (or blue) screen elements, e.g. the blue-emitting stripes B. As shown in FIG. 8, the first screen elements R and the bare portions of the faceplate 25 are coated with a film 63 of a clear photosensitive polymeric substance such as PVA sensitized with ammonium or potassium dichromate. The film 63 is air dried and, as shown in FIG. 9, exposed to light projected at a second angle $\theta_2$ to the normal from the line light source, through the focus mask 31. The light hardens or renders less soluble exposed regions 65 of the film 63. Unexposed regions 67 of the film 63 are unhardened and have greater solubility than the exposed regions 65. The focus mask 31 is removed and the unexposed regions 67 are developed by washing the film 63 with a suitable developer, as is known in the art. As shown in FIG. 10, washing removes the more soluble unexposed regions leaving now bare areas of the faceplate 25 and retained film regions corresponding to the exposed regions 65. As shown in FIG. 11, a second phosphor material 69 is applied, preferably as a slurry, to coat the now bare areas of the faceplate 25 and the retained film regions 65. The slurry is similar to the previously described slurry except that the phosphor is a blue-emitting material. The excess slurry is removed from the faceplate 25 and the remaining slurry of second phosphor material 69 is dried. Then, the retained film regions 65 and the overcoating of second phosphor material 69 are removed by washing in $H_2O_2$. As shown in FIG. 12, the resulting structure includes bare locations on the faceplate 25, the stripes R of first phosphor material, and the stripes B of the second phosphor material which form the second phosphor screen elements. FIG. 12 also shows the paths of the outer electron beams 37A which are focused by the focus mask 31 to impinge on the second screen elements or stripes B. The convergence angle, $\phi_2$, of the electron beams 37A is different from the incident angle $\theta_2$ (FIG. 9) of the light used to expose the regions 65 of the film 63 for the reasons previously explained.

Figure 13:
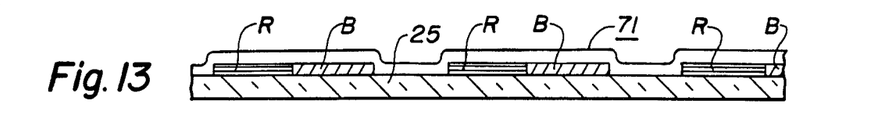
FIGS. 13–16 show the steps in forming on the support surface a multiplicity of third screen elements according to the invention.
Figure 14:
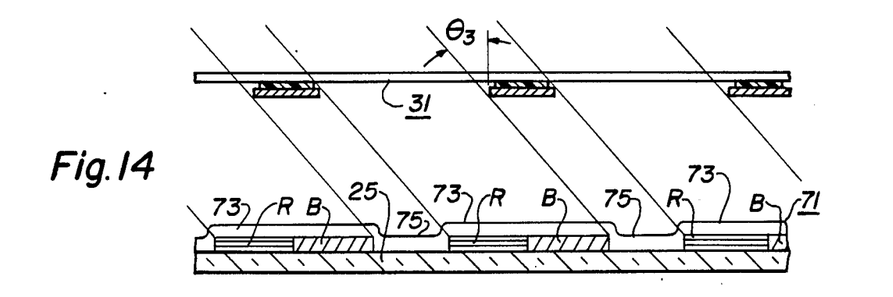
Figure 15:
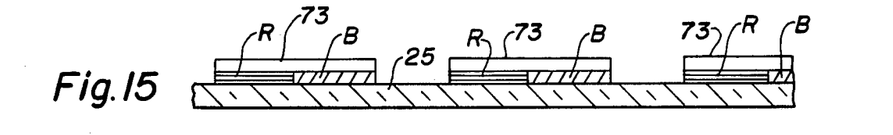
Figure 16:
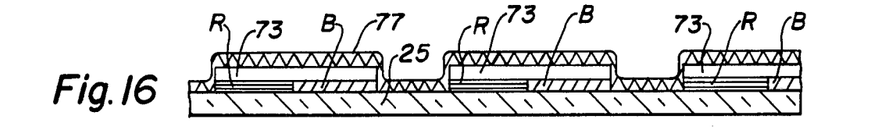
Figure 17:
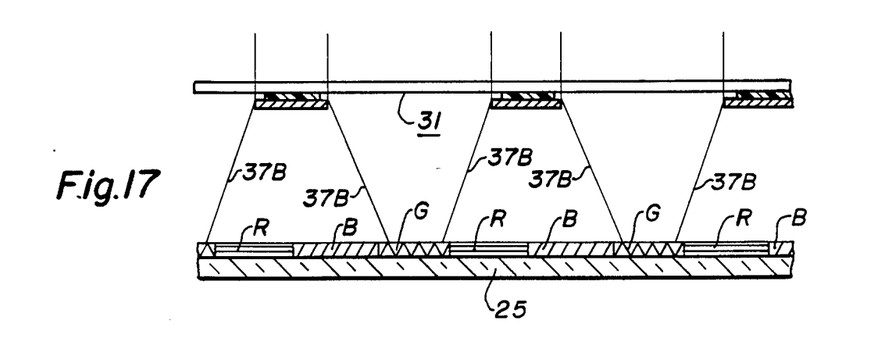
FIG. 17 shows the center electron beams passing through the focus mask and impinging on the third screen elements.

FIGS. 13–16 show the sequence of steps in forming the multiplicity of third (or green) screen elements, e.g. the green-emitting stripes, G. As shown in FIG. 13, the first screen elements R, the second screen elements B and the bare locations on the faceplate 25 are coated with a film 71 of a clear photosensitive polymeric substance such as PVA sensitized with ammonium or potassium dichromate. The film 71 is air dried and, as shown in FIG. 14, exposed to light projected at a third angle $\theta_3$ to the normal from the line light source, through the focus mask 31. The light hardens or renders less soluble exposed regions 73 of the film 71. Unexposed regions 75 of the film 71 are unhardened and have greater solubility than the exposed regions 73. The focus mask 31 is removed and the unexposed regions 75 are developed by washing the film 71 with a suitable developer, as is known in the art. As shown in FIG. 15, washing removes the more soluble unexposed regions 75 leaving now bare areas of the faceplate 25 and retained film regions corresponding to the exposed regions 73 overlying the first and second screen elements, R and B, respectively. As shown in FIG. 16, a third phosphor material 77 is applied, preferably as a slurry, to coat the now bare areas of the faceplate 25 and the retained film regions 75. The slurry is similar to the previously described slurries except that the phosphor is a green-emitting material. The excess slurry is removed from the faceplate and the remaining slurry of third phosphor material 77 is dried. Subsequently, the retained film regions 73 and the overcoating of third phosphor material 77 are removed by washing in $H_2O_2$. As shown in FIG. 17, the resulting structure comprises the previously formed stripes R and B and the recently formed stripes G of third phosphor material which forms the third phosphor screen element. The R, B and G stripes form an array of three different emission colors arranged in cyclic order. FIG. 17 also shows that the paths of the center electrons beams 37B are substantially normal to the focus mask 31 and are focused after passing therethrough so as to impinge on the third screen elements G. Again, the incident angle $\theta_3$ of the light projected to exposed regions 73 of the film 71 is different from the normal incidence of the center electron beams 37B.

GENERAL CONSIDERATION

The method of forming a screen as described herein is not limited to using a quadrupole focus mask of bilateral-type shown in FIG. 2, but also may be used with equivalent quadrupole-type focus masks such as a unilateral quadrupole focus mask and the woven quadrupole mask. Examples of all three types of quadrupole focus masks are shown and described in U.S. Pat. No. 4,059,781 referenced herein. Additionally, the method described herein may also be utilized with a mesh lens focus mask of the type described in U.S. Pat. No. 4,514,658 issued to Bloom on Apr. 30, 1985. A general requirement of a focus mask used as an optical pattern is that the vertical bars of the focus mask be of sufficient width that the shadowed areas on the screen be approximately ⅓ the horizontal period, i.e. ⅓ the total width of the three phosphor stripes, R, B and G associated with each of the focus mask apertures. The width of the shadowed area on the screen is a function not only of the width of the vertical bars of the shadow mask but also of the distance from the shadow mask to the screen. While the present screening method is shown, for simplicity, without a black matrix between adjacent screen elements, such a structure is within the scope of the present invention.

What is claimed is:

1. A method of producing a luminescent viewing screen for a color cathode-ray tube, said tube having therein a support surface for said viewing screen, a focus mask having a multiplicity of apertures therethrough in spaced relation to said support surface, said viewing screen comprising a multiplicity of screen elements of a plurality of different color-emitting phosphors, each of said screen elements being smaller than any of said apertures in said focus mask, means for generating and directing a plurality of electron beams which converge at different angles and impinge upon said screen elements, the method including the steps of:
  a. coating said support surface with a film of a photosensitive polymeric substance,
  b. exposing said film to actinic radiation from a line light source projected at a first angle through said apertures in said focus mask until the solubility of the irradiated regions thereof is selectively altered, thereby producing in said film regions of greater solubility at locations shielded by said mask from said actinic radiation and regions of lesser solubility at locations exposed to said actinic radiation through the apertures of said mask,
  c. removing those regions of said film with greater solubility,
  d. coating now bare areas of said support surface and the retained film regions with a first phosphor material, and
  e. removing the retained film regions and the overcoating of phosphor material thereon to expose portions of said support surface while retaining the first phosphor material on adjacent portions of the support surface thereby forming a multiplicity of first screen elements, the convergence angle of the electron beam impinging upon the first screen elements being different from said first angle of exposure to actinic radiation from said line light source.

2. The method as described in claim 1, further including the steps of:
  i. coating said multiplicity of first screen elements and the exposed portions of said support surface with a film of said photosensitive polymeric substance,
  ii. exposing said film to actinic radiation from a line light source projected at a second angle through said apertures in said focus mask until the solubility of the irradiated regions thereof is selectively altered, thereby producing in said film regions of greater solubility at locations shielded by said mask from said actinic radiation and regions of lesser solubility at locations exposed to said actinic radiation through said apertures in said mask,
  iii. removing those regions of said film with greater solubility,
  iv. coating now bare areas of said support surface and the retained film regions with a second phosphor material, and
  v. removing the retained film regions and the overcoating second phosphor material thereon to expose the first screen elements and adjacent locations of said support surface while retaining the second phosphor material on the support surface thereby forming a multiplicity of second screen elements, the convergence angle of the electron beam impinging upon the second screen elements being different from said second angle of exposure to actinic radiation from said line light source.

3. The method as described in claim 2, wherein said second angle of exposure is different from said first angle of exposure and said second phosphor material is different from said first phosphor material.

4. The method as described in claim 2, further including the steps of:
  i. coating the first and second screen elements and the adjacent locations of said support surface with a film of said photosensitive polymeric substance,
  ii. exposing said film to actinic radiation from a line light source projected at a third angle through said apertures in said focus mask until the solubility of the irradiated regions thereof is selectively altered, thereby producing in said film regions of greater solubility at locations shielded by said mask from said actinic radiation and regions of lesser solubility at locations exposed to said actinic radiation through said apertures in said mask,
  iii. removing those regions of said film with greater solubility,
  iv. coating now bare areas of said support surface and rthe retained film regions with a third phosphor material, and
  v. then removing the retained film regions and the overcoating third phosphor material thereon to expose the first and second screen elements while retaining the third phosphor material on the support surface, thereby forming a multiplicity of third screen elements, the convergence angle of the electron beam impinging upon the third screen elements being different from said third angle of exposure to actinic radiation from said line light source.

5. The method as described in claim 4, wherein said third angle of exposure is different from said first and said second angles of exposure and said third phosphor material is different from said first and said second phosphor materials.

6. A method for producing a luminescent viewing screen for a color cathode-ray tube, said tube having therein a support surface for said viewing screen, a quadrupole focus mask having a multiplicity of apertures therethrough in spaced relation to said support surface, said viewing screen comprising a multiplicity of screen elements of three different color-emitting phosphors, each of said screen elements of three different color-emitting phosphors, each of said screen elements being smaller than any of said apertures in said focus mask, means for generating and directing three electron beams which converge at different angles and impinge upon said screen elements, the method including the steps of:
  a. coating said support surface with a film of a clear photosensitive polymeric substance,
  b. drying said substance,
  c. exposing said film to actinic radiation projected at a first angle through said apertures in said focus mask until the solubility of the irradiated regions thereof is selectively altered, thereby producing in said film regions of greater solubility at locations shielded by said mask from said actinic radiation and regions of lesser solubility at locations exposed to said actinic radiation through the apertures in said mask,
  d. removing those regions of said film with greater solubility,
  e. coating now bare areas of said support surface and the retained film regions with a slurry of a first phosphor material,
  f. drying said first phosphor material,
  g. removing the retained film regions and the overcoating first phosphor material thereon to expose bare portions of said support surface while retaining said first phosphor material on the support surface, thereby forming a multiplicity of first screen elements, the convergence angle of the electron beam impinging upon the first screen elements being different from said first angle of exposure to actinic radiation from said line light source, h. coating said first screen elements and the bare portions of said support surface with a film of said clear photosensitive polymeric substance, i. drying said substance, j. exposing said film to actinic radiation projected at a second angle through said apertures in said focus mask until the solubility of the irradiated regions thereof is selectively altered, thereby producing in said film regiions of greater solubility at locations shielded by said mask from said actinic radiation and regions of lesser solubility at locations exposed to said actinic radiation through said apertures in said mask, k. removing those regions of said film with greater solubility, l. coating now bare areas of said support surface and the retained film regions with a slurry of a second phosphor material, m. drying said second phosphor material, n. removing the retained film regions and the overcoating second phosphor material thereon to expose said first screen elements and bare locations of said support surface while retaining the second phosphor material on the support surface, thereby forming a multiplicity of second screen elements, the convergence angle of the electron beam impinging upon the second screen elements being different from said second angle of exposure to actinic radiation from said line light source, o. coating said first and second screen elements and the bare locations of said support surface with a film of said clear photosensitive polymeric substance.

p. drying said substance, q. exposing said film to actinic radiation projected at a third angle through said apertures in said focus mask until the solubility of the irradiated regions thereof is selectively altered, thereby producing in said film regions of greater solubility at locations shielded by said mask from said actinic radiation and regions of lesser solubility at locations exposed to said actinic radiation through said apertures in said mask, r. removing those regions of said film with greater solubility, s. coating now bare areas of said support surface and the retained film regions with a slurry of a third phosphor material, t. drying said third phosphor material, and u. then, removing the retained film regions and the overcoating third phosphor material thereon to expose said first and said second screen elements while retaining the third phosphor material on the support surface, thereby forming a multiplicity of third screen elements, the convergence angle of the electron beam impinging upon the third screen elements being different from said third angle of exposure to actinic radiation from said line light source.

* * * * *

UNITED STATES PATENT AND TRADEMARK OFFICE
CERTIFICATE OF CORRECTION

PATENT NO. : 4,778,738

DATED : Oct. 18, 1988

INVENTOR(S) : Steven Alan Lipp et al.

It is certified that error appears in the above-identified patent and that said Letters Patent is hereby corrected as shown below: Title page:

[73] change "RCA Licensing" to --RCA Licensing Corporation--.

Signed and Sealed this

Seventeenth Day of October, 1989

*Attest:*

DONALD J. QUIGG

*Attesting Officer*  *Commissioner of Patents and Trademarks*